United States Patent [19]

McMillan et al.

[11] Patent Number: 4,713,157
[45] Date of Patent: Dec. 15, 1987

[54] COMBINED INTEGRATED CIRCUIT/FERROELECTRIC MEMORY DEVICE, AND ION BEAM METHODS OF CONSTRUCTING SAME

[75] Inventors: Larry McMillan; Carlos Paz de Araujo, both of Colorado Springs, Colo.; George A. Rohrer, Chassell, Mich.

[73] Assignee: Ramtron Corporation, Colorado Springs, Colo.

[21] Appl. No.: 733,939

[22] Filed: May 14, 1985

Related U.S. Application Data

[63] Continuation-in-part of Ser. No. 695,969, Jan. 29, 1985, which is a continuation-in-part of Ser. No. 133,338, Mar. 24, 1980, which is a continuation-in-part of Ser. No. 658,199, Feb. 17, 1976, Pat. No. 4,195,355, which is a continuation-in-part of Ser. No. 316,417, Dec. 18, 1972, Pat. No. 3,939,292, which is a continuation-in-part of Ser. No. 076,059, Sep. 28, 1970, Pat. No. 3,728,694.

[51] Int. Cl.$^4$ .............................................. C23C 14/00
[52] U.S. Cl. ........................... 204/192.11; 204/192.2; 204/192.25
[58] Field of Search ......... 204/192 M, 192 N, 192.11, 204/192.2, 192.25

[56] References Cited

U.S. PATENT DOCUMENTS

| | | | |
|---|---|---|---|
| 3,728,694 | 4/1973 | Rohrer | 340/173.2 |
| 4,091,138 | 5/1978 | Takaki et al. | 204/192.11 |
| 4,108,751 | 8/1978 | King | 204/192.11 |
| 4,139,857 | 2/1979 | Takaki et al. | 204/192.11 |
| 4,147,573 | 4/1979 | Morimoto | 204/192.11 |
| 4,149,301 | 4/1979 | Cook | 29/604 |
| 4,149,302 | 4/1979 | Cook | 29/604 |
| 4,195,355 | 3/1980 | Rohrer | 427/248.1 |
| 4,250,009 | 2/1981 | Cuomo . | |

OTHER PUBLICATIONS

Chemical Abstracts, 9th Collective Index, (1972–1976), p. 14931, G.S.
Castellano et al., J. Applied Physics, Jun. 1979, pp. 4406–4411.
Chemical Abstracts, 10th Collective Index, pp. 22572–22573.
Vossen et al., Thin Film Processes, Academic Press, N.Y., N.Y., 1978, p. 41, pp. 120–121.
Castellano, Ferroelectrics, 1980, vol. 28, pp. 387–390.

*Primary Examiner*—Arthur P. Demers
*Attorney, Agent, or Firm*—Irving M. Weiner; Edward D. Manzo

[57] ABSTRACT

Methods for forming targets of ferroelectric, metal nitrate or similar material, methods for depositing such materials using ion beam techniques, and a method for forming a combined and integrated circuit/ferroelectric memory device wherein the ferroelectric material is deposited using ion beam techniques.

13 Claims, 8 Drawing Figures

COMBINED INTEGRATED CIRCUIT/FERROELECTRIC MEMORY DEVICE, AND ION BEAM METHODS OF CONSTRUCTING SAME

This application is a continuation-in-part of McMillan et al U.S. patent application Ser. No. 695,969 filed Jan. 29, 1985, which in turn is a continuation-in-part of Rohrer and McMillan U.S. patent application Ser. No. 133,338 filed Mar. 24, 1980, which in turn is a continuation-in-part of Rohrer Ser. No. 658,199, filed Feb. 17, 1976, now U.S. Pat. No. 4,195,355, which in turn is a continuation-in-part of Rohrer Ser. No. 316,417, filed Dec. 18, 1972, now U.S. Pat. No. 3,939,292, which in turn is a continuation-in-part of Rohrer Ser. No. 076,059, filed Sept. 28, 1970 U.S. Pat. No. 3,728,694. The complete disclosure of the aforementioned patent applications and patents is incorporated herein by reference thereto.

BACKGROUND OF THE INVENTION

The present invention relates to a combined integrated circuit/ferroelectric memory device, methods of constructing and utilizing such devices, methods for depositing ferroelectric, metal nitrate or similar materials using ion beam techniques, and methods for forming targets of ferroelectric, metal nitrate or similar materials which are used in ion beam deposition techniques.

The relevant art pertaining to integrated circuit/ferroelectric memory devices is exemplified by the following U.S. Pat. Nos.: Karan 2,803,519; Feldman 2,922,730; Bertelsen 3,110,620; Kaufman 3,142,044; Triller 3,193,408; Fatuzzo et al 3,213,027; Ostis 3,274,025; Fatuzzo 3,274,567; Fatuzzo et al 3,281,800; Kaiser et al 3,305,394; Delaney et al 3,365,631; Schuller et al 3,381,256; Nolta et al 3,405,440; Hastings 3,508,213; Galla et al 3,607,386; Carbonel 3,611,558; Sawyer 3,623,030; Lapham, Jr. et al 3,864,817; Coldren et al 3,877,982; Kobayashi 3,886,582; Francombe et al 4,047,214; Brissot et al 4,119,744; Hedel 4,195,333; Ruppel et al 4,259,365; and Ruppel et al 4,348,611; an article entitled "Ferroelectric and Other Properties of Polycrystalline Potassium Nitrate Films" by Nolta et al at pages 269-291 of a 1967 "Ferroelectricity" book edited by Edward F. Weller; a publication by Nolta et al, "Dielectric Behavior of Films of Vacuum-Deposited Potassium Nitrate," Chemical Abstracts 71:106543k, 1969; and all the art identified in Rohrer U.S. Pat. No. 4,195,355, column 1, lines 35-58.

However, none of this relevant art provides an integrated circuit/ferroelectric memory device with the characteristics of the present invention.

IBM Research Report by J. M. E. Harper, RC 8192 (#35141) 2/4/80, entitled *Ion Beam Applications to Thin Films*, discloses several methods of film deposition using ion beams. However, this report does not disclose that the ion beam deposition methods can be used in depositing ferroelectric, metal nitrate or similar materials.

Three articles by R. N. Castellano entitled, *Ion Beam Deposition of Ferroelectric Thin Films Sputtered from Multicomponent Targets*, J. Vac. Sci. Technol., 17(2), Mar/Apr 1980, pp 629-633; *Deposition of Thin Films of PZT by a Focused Ion Beam Sputtering Technique*, Ferroelectrics, 1980, Vol. 20, pp 387-390; and *Ion-Beam Deposition of Thin Films of Lead Zirconium Titanate*, J. Appl. Physics, 50(6), June 1979, pp 4406-4411, disclose a method for the deposition of Lead Zirconium Titanate $[Pb(Zr_xTi_{1-x})O_3]$ which is a mixed oxide ferroelectric material. However, the methods disclosed in these articles do not teach or suggest the use of ion beam deposition techniques for any material other than Lead Zirconium Titanate.

Additionally, these articles do not disclose or suggest the presently claimed method for forming target beds of ferroelectric, metal nitrate or similar materials, but rather discuss the use of commercially available hot pressed targets. Many ferroelectric, metal nitrate and similar materials, such as potassium nitrate, cannot be hot pressed into suitable target beds.

SUMMARY OF THE INVENTION

The present invention provides a method of fabricating a combined integrated circuit/ferroelectric memory device, including the steps of removing predetermined portions of a surface of an integrated circuit for providing contacts with the input/output logic of the integrated circuit, and thereafter depositing a first conductive layer. The method proceeds with removing undesired portions of the first conductive layer, depositing a ferroelectric layer using ion beam techniques, and then depositing a second conductive layer. The method proceeds with then removing undesired portions of the ferroelectric layer and of the second conductive layer, depositing a passivation layer, and then removing undesired portions of the passivation layer. The method then proceeds with depositing a third conductive layer for electrically connecting the second conductive layer to the input/output logic of the integrated circuit, and thereafter removing undesired portions of the third conductive layer.

The present invention is further directed to the discovery that ion beam deposition techniques, which provide a great amount of control over film quality and composition, can effectively be used for depositing ferroelectric, metal nitrate or similar materials in application such as the memory devices, discussed above, or any other desirable application.

Additionally, the present invention provides a method for forming targets of ferroelectric, metal nitrate or similar materials used in ion beam deposition techniques.

An object of the present invention is to provide a device and a method as described and/or claimed herein wherein the ferroelectric layer which is deposited comprises and/or includes Phase III potassium nitrate.

An additional object of the present invention is to provide a device and a method as described and/or claimed herein wherein the ferroelectric layer is deposited using ion beam techniques.

Another object of the present invention is to provide a device and a method as described and/or claimed herein wherein the ferroelectric layer and the second conductive layer are both deposited during a single pumpdown, i.e., under the same vacuum condition.

A further object of the present invention is to provide a device and a method as described and/or claimed herein wherein undesired portions of the ferroelectric layer and the second conductive layer are removed by means of ion beam milling.

Yet another object of the present invention is to provide a method and a device as described and/or claimed herein wherein the ferroelectric layer has a thickness of less than 110 microns, and preferably falling within the range of from 100 Angstrom units to 5,000 Angstrom units.

A further object of the present invention is to provide a device and a method as described and/or claimed herein wherein after the step of depositing the ferroelectric layer, and prior to depositing the second conductive layer, there is included the step of filling any grain boundaries, cracks and/or imperfections in the ferroelectric layer with insulative material.

Another object of the present invention is to provide a a device and a method as described and/or claimed herein wherein prior to the step of depositing the first conductive layer, there is included the steps of forming first layer interconnects on the surface of the semiconductor integrated circuit, and thereafter depositing a non-semiconductor dielectric and forming interconnect and bonding pad vias therein.

A further object of the present invention is to provide a device and a method as described and/or claimed herein wherein the step of depositing the second conductive layer includes the deposition of a conductive layer forming a top electrode, wherein this conductive layer is selected from the group consisting essentially of conductive metal oxides, metals and metal alloys which will oxidize to form conductive oxides.

An additional object of the present invention is to provide a device and a method as described and/or claimed herein wherein the first layer interconnects are composed of doped polysilicon.

A further object of the present invention is to provide a method and a device as described and/or claimed herein wherein the non-semiconductor dielectric and/or passivation layer is selected from the group consisting of low temperature glass, silicon dioxide, silicon nitride, oxides, and sputtered and/or evaporated dielectrics.

Another object of the present invention is to provide a device and a method as described and/or claimed herein wherein the Phase III potassium nitrate layer has a thickness within a range of from 100 Angstrom units to 25,000 Angstrom units.

A further object of the invention is to provide a device and a method as described and/or claimed herein wherein the Phase III potassium nitrate layer has a thickness of less than 2 microns and is stable at room temperature.

Another object of the present invention is to provide a device and a method as described and/or claimed herein wherein after deposition of the first conductive layer, and prior to the deposition of the ferroelectric layer, there is included the step of depositing a second non-semiconductor dielectric and forming vias therein.

An additional object of the present invention is to provide a method as described and/or claimed herein for depositing ferroelectric, metal nitrate or similar materials by ion beam techniques.

Yet another object of the present invention is to provide a method as described and/or claimed herein for forming targets of ferroelectric, metal nitrate or similar materials used in ion beam deposition techniques, and targets formed by such methods.

A further object of the present invention is to provide combined integrated circuit/ferroelectric memory devices produced in accordance with any of the methods described and/or claimed herein.

Further details, objects and advantages of the invention will become apparent as the following description of the present preferred embodiments thereof and presently preferred methods of making and practicing the same proceeds.

DETAILED DESCRIPTION OF SOME PREFERRED EMBODIMENTS

Figure 1:
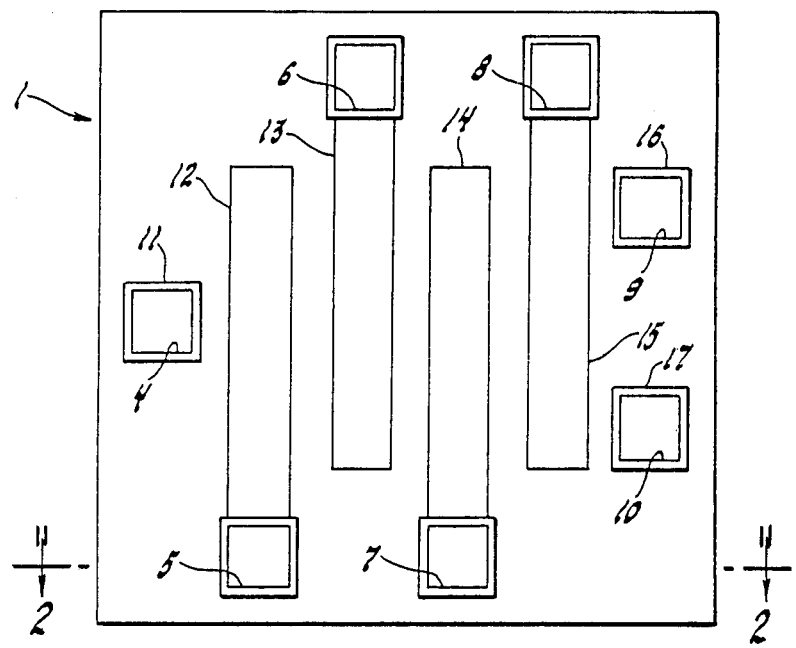
FIG. 1 shows a top plan view of an integrated circuit chip depicting connections to the integrated circuit driving logic through first cuts in a surface of the integrated circuit.
Figure 2:
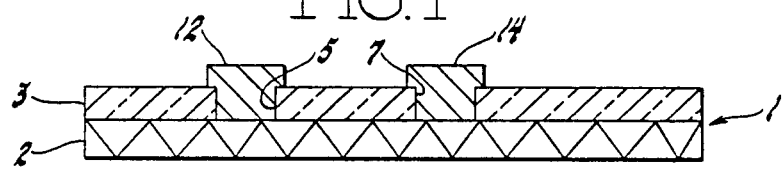
FIG. 2 illustrates a sectional view taken along the line 2—2 shown in FIG. 1.

With reference to FIGS. 1 and 2 there is shown an integrated circuit chip 1 with its input/output driving logic 2 covered by a protective layer 3, such as, for example formed of silicon dioxide. The first step in the novel process is to remove predetermined portions of the layer 3 of the integrated circuit 1 for providing contacts with the input/output logic 2 of the integrated circuit 1. This is done by forming holes 4, 5, 6, 7, 8, 9 and 10 by ion beam, or photoresist and etching techniques.

When this step has been completed, the next step is to deposit a first conductive layer which is then defined and cut by standard photoresist and etching techniques to form the first conductive layer portions 11–17 as shown in FIG. 1.

Figure 3:
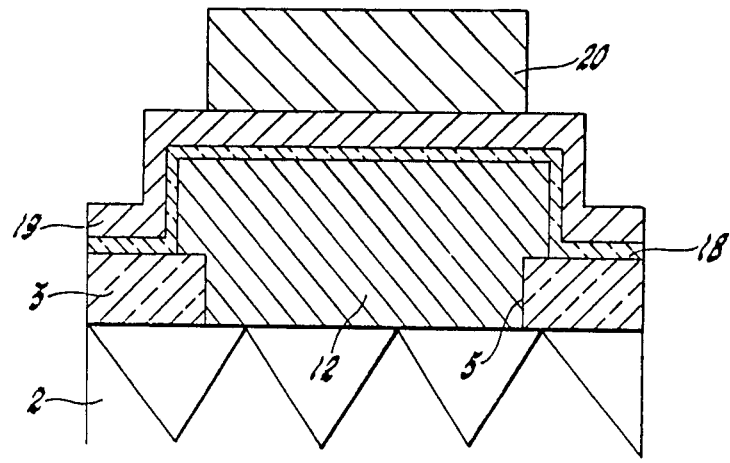
FIG. 3 illustrates a cross-section of a further stage in the method showing the first conductive layer on which has been deposited a ferroelectric layer, and upon which in turn has been deposited a second conductive layer, and upon which in turn has been deposited photoresist.

Thereafter, there is deposited a ferroelectric layer 18, such as for example Phase III potassium nitrate, by ion beam techniques in an ion beam apparatus. There is also formed or deposited a second conductive layer 19, as shown in FIG. 3. Preferably, but not necessarily, a ferroelectric layer 18 and the second conductive layer 19 are deposited during a single pumpdown, i.e., under vacuum conditions, which are more fully described in the aforementioned U.S. Pat. Nos. 3,728,694; 3,939,292, and 4,195,355, and the aforementioned U.S. patent application Ser. No. 133,338, all of which is incorporated herein by reference thereto.

The chips or wafers are then removed from the vacuum system. Then various photoresist steps are performed, such as to define the memory cells, to develop and to hard bake. The purpose of the hard baking is to harden up the resist material so that such material is very resistant and hard.

After the photoresist pattern has been developed and hard baked, the wafer with the resist pattern thereon, such as the photoresist 20 as shown in FIG. 3, is placed into an appropriate machine for removing undesired portions of the second conductive metal 19 and the ferroelectric layer 18, except in those areas which are protected by the photoresist 20. Although the aforementioned machine may constitute a sputtering machine, in accordance with a preferred embodiment of the present invention the machine employed is an ion beam machine which will bombard the entire wafer or chip with ions to "etch" out all of the metal 19 and ferroelectric material 18 where desired.

Figure 4:
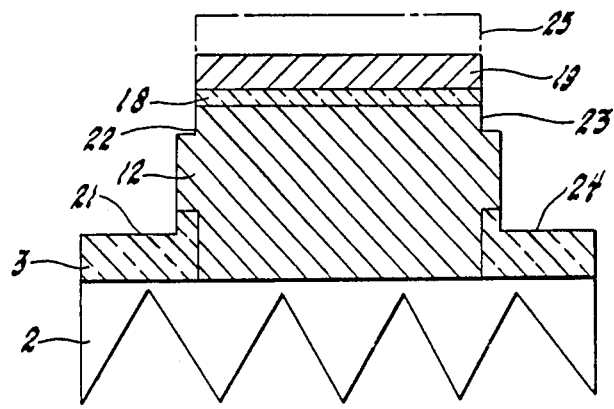
FIG. 4 illustrates a cross-section of a further stage in the method in which undesired portions of the first conductive layer, ferroelectric layer and second conductive layer have been removed by ion beam milling, and also indicating the remaining resist ashed off in vacuum.

With reference to FIG. 4, it should be noticed that various areas, such as areas 21, 22, 23 and 24, have been ion beam milled to an over-etched condition. It should also be noticed that this ion beam milling or over-etching eliminates or knocks off sharp corners of the structure.

The ion beam milling procedure is carried out under vacuum conditioned or under a pumpdown. During this same pumpdown or vacuum condition, it is preferable to oxidize or ash off the remaining photoresist 20 (as shown in FIG. 3) which is indicated by the phantom line portion 25 in FIG. 4. In the preferred embodiment, this ashing off or oxidation step is performed in the ion beam machine under vacuum. A predetermined quantity of oxygen is bled into the machine, and the raw oxygen then attacks the photoresist 20. The photoresist 20 is similar to a plastic. The oxygen decomposes the plastic or resist 20, and the decomposition products are pumped out.

Thereafter, a passivation layer, such as glass 26 (see FIG. 6) is deposited over the chip 1. Preferably, glass is evaporated over the entire wafer or chip. This also is done during the same single pumpdown or vacuum condition which prevails for the ion beam milling and ashing off process step mentioned hereinabove.

Figure 5:
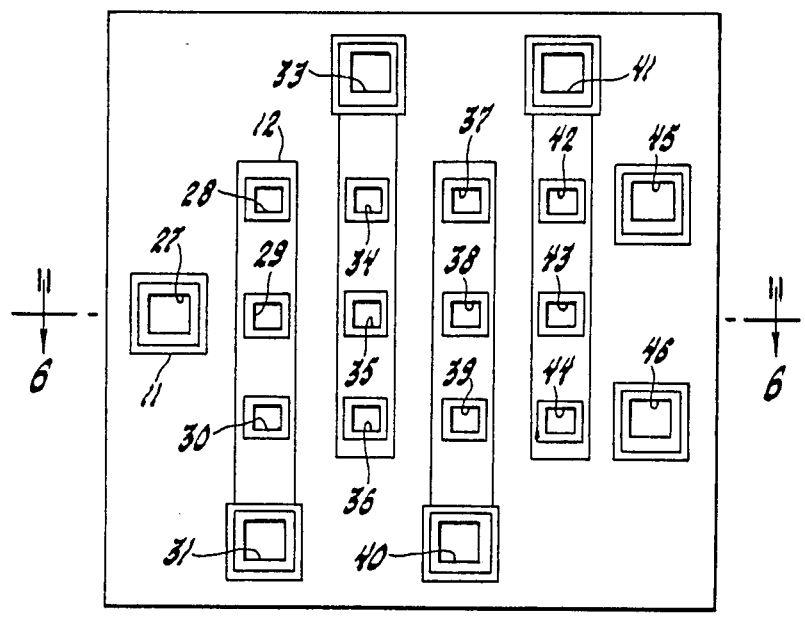
FIG. 5 illustrates a top plan view of a further stage in the method showing the openings to the second conductive layer at each cell, and the openings for the contacts to the substrate pads for the top electrodes.
Figure 6:
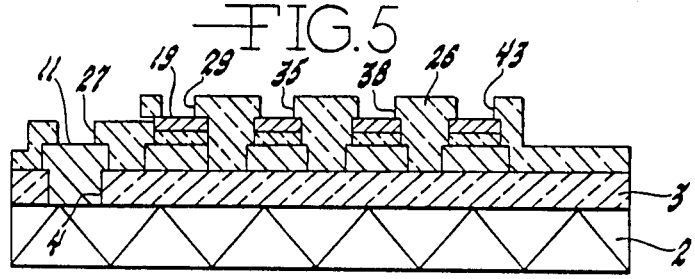
FIG. 6 illustrates a sectional view taken along the line 6—6 shown in FIG. 5.

Thereafter the chips or wafers, in the form partially illustrated in FIG. 4, are removed from the ion beam system or machine. The next step is to remove undesired portions of the passivation layer 26. This is done by standard photoresist/etch techniques to open the top contacts to the cells, and to open the contacts to the substrate pads for the top electrodes. As shown in FIGS. 5 and 6, this photoresist/etching step produces the cut vias 27–45.

There is thereafter deposited a third conductive layer 47 over the entire chip to electrically connect the second conductive layer 19 to desired portions of the input/output circuit 2 of the integrated circuit chip 1. This is followed by photoresist/etching steps to define the top metal electrode to connect the top electrode to the substrate pads. This is best illustrated in connection with FIGS. 7 and 8.

Figure 7:
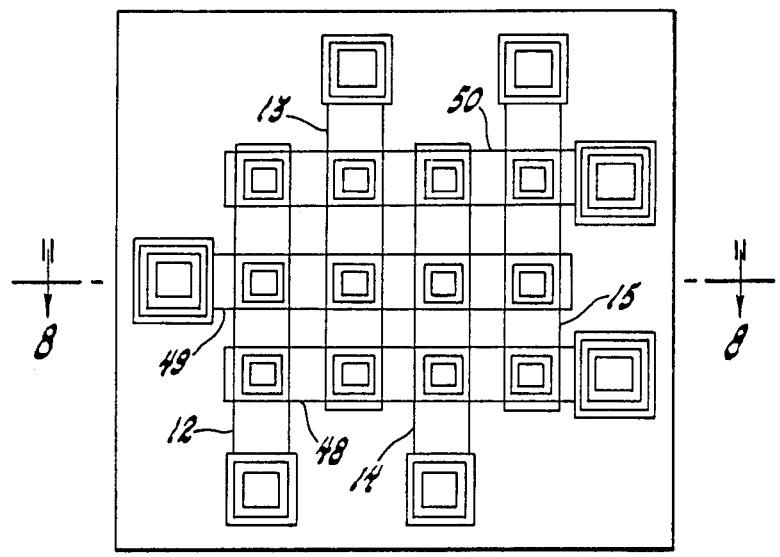
FIG. 7 illustrates a top plan view of the integrated circuit chip showing a further stage in the method wherein the third conductive layer has been applied to define a top metal electrode with its connection to the substrate pads.
Figure 8:
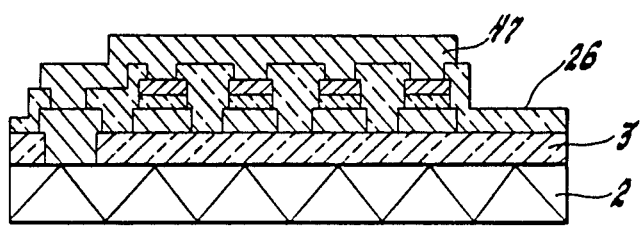
FIG. 8 illustrates a sectional view taken along the line 8—8 shown in FIG. 7.

In FIGS. 7 and 8 there are shown the bottom electrodes 12, 13 and 14 and the orthogonally arranged top electrodes 48, 49 and 50, such top electrodes being formed from the aforementioned deposited third conductive layer 47.

Thereafter, the invention contemplates the optional step of passivation for the entire chip 1, and especially for the top electrodes in order to provide scratch protection. This may be done, if desired, by depositing another layer of a passivation material, such as glass and then to cut out those areas where bonding pads would be exposed. In other words, this may be done by placing a photoresist over the entire chip after the top passivation, and then cutting holes down to the bonding pads which would go out therefrom.

The term "ferroelectric layer" as used herein means any and all ferroelectric materials.

The terms "passivation layer", "insulative material", "passivation coating", "non-semiconductor dielectric" and "passivation material" includes, but is not limited to, silicon dioxide, silicon nitride, glass, and sputtered and/or evaporated dielectrics.

Ion beam techniques for the deposition of thin films involve adjustably mounting a target bed of a material to be deposited and a substrate in an ion beam machine, pumping down the machine to an appropriate vacuum level, and directing a beam of high energy particles from a suitable ion source at the target bed whereby molecular sized amounts of the material are ejected from the target bed and subsequently deposited on the substrate.

Ion beam deposition techniques are particularly useful because an ion plasma is contained in an ion gun or ion source so that the target bed and substrate are maintained in a plasma-free environment at ground potential whereby several parameters which affect thin film properties such as substrate and target angle, substrate and target position, substrate temperature, etc. can be varied. The flexibility with which these parameters may be varied provides ease of control of film composition.

Substrates which may be used in the present invention include, but not exclusively, integrated circuit chips, as discussed above, single crystal or polycrystalline dielectrics, glass, ceramics, metallic films, polymeric films, etc.

Preferably, the ion beam is composed of argon, but other inert or reactive gasses can also be used.

Existing ion beam deposition methods use hot pressed or otherwise commercially available target beds. However, many ferroelectric, metal nitrate and similar materials cannot be hot-pressed into suitable target beds and are not commercially available for many reasons, including moisture sensitivity. For these reasons, many ferroelectric, metal nitrate and similar materials have not been deposited by ion beam techniques.

The present inventors have discovered a method whereby suitable target beds of such ferroelectric, metal nitrate and similar material can be formed, and whereby the materials can, therefore, be deposited using ion beam techniques.

In a method of the present invention suitable target beds of the ferroelectric, metal nitrate or similar materials are formed by heating a support member with an amount of the material supported thereon at a predetermined temperature until the material is completely melted. Thereafter, the heated member and the molten ferroelectric, metal nitrate or similar material are removed from heat, and cooled in a manner such that the material solidifies into a fine grained film which is tightly adhered or fused to the support member.

Suitable support members include, but not exclusively, aluminum, anodized aluminum, stainless steel, quartz, gold-plated, aluminum, and chrome-plated aluminum.

Preferably, but not exclusively, the support members are formed as shallow boats or planar members having a groove or very shallow cut formed in one surface. The groove or very shallow cut defines a recess in which molten ferroelectric, metal nitrate or similar material is contained.

A preferred, but not exclusive, method for cooling the support member and molten ferroelectric, metal nitrate or similar material involves directing a stream of a cool, dry gas at the approximate center of the bottom side of the support member (the side not contacting the molten material) whereby nucleation of the ferroelectric, metal nitrate or similar material begins approximately at the center of the support member and permeates outwardly therefrom.

Materials which can be formed into target beds, and deposited by the methods of the present invention includes any and all ferroelectric, metal nitrate, metal phosphate, sulfates and similar materials. Preferred ferroelectric materials include Phase III potassium nitrate, sodium nitrite, potassium dihydrogen phosphate, barium titanate and tri-glycerine sulfate.

While the present invention has been particularly shown and described with reference to preferred embodiments, it should be understood by those skilled in the art that changes and modifications in form and details may be made without departing from the spirit and scope of the present invention.

We claim:

1. A method of depositing a ferroelectric material by ion beam techniques, comprising:
   (a) mounting a target bed of a ferroelectric material in an ion beam machine;
   (b) mounting a substrate a predetermined distance from said target bed within said ion beam machine;
   (c) evacuating said ion beam machine to a predetermined vacuum level;
   (d) directing a beam of high energy particles at said target bed whereby molecular sized amounts of said ferroelectric material are ejected from said target bed and subsequently deposited on said substrate;
   (e) said ferroelectric material being selected from the group consisting of metal nitrates, metal nitrites, metal phosphates, and sulfates;
   (f) said target bet comprising a support member having an amount of ferroelectric materials substantially tightly adhered to one surface thereof; and
   (g) said supporting member being substantially planar and having a recess formed in one surface thereof for containing said ferroelectric material.

2. A method according to claim 1, wherein:
said ferroelectric material is selected from the group consisting of Phase III potassium nitrate, sodium nitrite, potassium dihydrogen phosphate, and tri-glycerine sulfate.

3. A method according to claim 1, wherein:
said target bed is formed by heating said support member and a predetermined amount of said ferroelectric material at a predetermined temperature until said ferroelectric material is melted; and
cooling said predetermined amount of ferroelectric material so that it solidifies into a substantially fine grained film which is substantially tightly adhered to said support member.

4. A method according to claim 3, wherein:
said cooling of said ferroelectric material proceeds from the approximate center thereof outwardly whereby nucleation of said ferroelectric material permeates from said approximate center thereof outwardly.

5. A method according to claim 4, wherein:
said support member is selected from the group consisting of aluminum, anodized aluminum, gold plated aluminum, chrome plated aluminum, stainless steel, and quartz.

6. A method according to claim 5, wherein:
said substrate is selected from the group consisting of integrated circuit chips, single crystal dielectrics, polycrystalline dielectrics, glass, ceramics, metallic films and polymeric films.

7. A method of forming target beds for use in an ion beam deposition process, comprising:
   (a) heating a support member having a predetermined amount of a material supported thereon at a predetermined temperature until said material is melted;
   (b) cooling said material so that it solidifies into a substantially fine grain film which is substantially tightly adhered to said support member;
   (c) said support member is substantially planar and has a recess formed in one surface thereof for containing said material; and
   (d) said cooling of said material proceeds from the approximate center thereof outwardly whereby nucleation of said material permeates from said approximate center thereof outwardly.

8. A method according to claim 7, wherein:
said support member is selected from the group consisting of aluminum, anodized aluminum, gold-plated aluminum, chrome-plated aluminum, stainless steel, and quartz.

9. A method according to claim 8, wherein:
said material is selected from the group consisting of ferroelectric materials, metal nitrates, and metal nitrites.

10. A method of fabricating a combined integrated circuit/ferroelectric device comprising the steps of:
    (a) removing predetermined portions from a protective dielectric surface which covers an integrated circuit for providing contacts with the input/output logic of said integrated circuit;
    (b) depositing and defining a first conductive layer over said protective dielectric surface;
    (c) depositing a ferroelectric layer using ion beam techniques over said first conductive layer;
    (d) depositing a second conductive layer over said ferroelectric layer;
    (e) defining said ferroelectric layer and said second conductive layer including ion milling or overetching portions of said second conductive layer, said ferroelectric layer, and said protective dielectric surface;
    (f) depositing and defining a passavation layer;
    (g) depositing a third conductive layer for electrically coupling the defined second conductive layer to said input/output logic, and defining said third conductive layer.

11. A method according to claim 10, wherein:
said ferroelectric layer comprises Phase III potassium nitrate.

12. A method according to claim 11, wherein:
said step of depositing said ferroelectric layer and said step of depositing said second conductive layer are performed under vacuum conditions during the same pumpdown;
said step of defining said ferroelectric layer and said second conductive layer is performed at least partially by means of ion beam techniques; and
said ion milling or overetching step includes ion milling or overetching said first conductive layer.

13. A method according to claim 12, wherein:
after said step of depositing said second conductive layer, there is performed a step of applying photoresist to define a single memory cell at each crossover point between said first and second conductive layers;
and thereafter there is performed the step of ion beam milling off of said ferroelectric layer and said second conductive layer except where the photoresist defines the memory cell pattern;
and thereafter the remaining resist is ashed off; and
said steps of ion beam milling and ashing off remaining resist, and depositing said passivation layer are all conducted under vacuum conditions during a single pumpdown.

* * * * *